United States Patent
Nishimaki et al.

(10) Patent No.: US 7,191,929 B2
(45) Date of Patent: Mar. 20, 2007

(54) METHOD OF MEASURING THICKNESS OF BONDED BALL IN WIRE BONDING

(75) Inventors: Kimiji Nishimaki, Tokyo (JP); Noritaka Horiuchi, Tokyo (JP)

(73) Assignee: Kaijo Corporation, Tokyo (JP)

( * ) Notice: Subject to any disclaimer, the term of this patent is extended or adjusted under 35 U.S.C. 154(b) by 0 days.

(21) Appl. No.: 11/216,410

(22) Filed: Aug. 31, 2005

(65) Prior Publication Data

US 2006/0054662 A1   Mar. 16, 2006

(30) Foreign Application Priority Data

Sep. 2, 2004   (JP)   .............................. 2004-255150

(51) Int. Cl.
*H01L 21/00* (2006.01)
*B23K 31/12* (2006.01)

(52) U.S. Cl. .................... 228/105; 228/103; 228/110.1

(58) Field of Classification Search ................ 228/103, 228/105, 110.1
See application file for complete search history.

(56) References Cited

U.S. PATENT DOCUMENTS

| | | | | |
|---|---|---|---|---|
| 5,365,341 A | * | 11/1994 | Sugawara | 356/394 |
| 5,394,246 A | * | 2/1995 | Sugawara | 356/394 |
| 5,396,334 A | * | 3/1995 | Sugawara | 356/394 |
| 5,456,403 A | * | 10/1995 | Nishimaki et al. | 228/102 |
| 5,458,280 A | * | 10/1995 | Nishimaki et al. | 228/102 |
| 5,474,224 A | * | 12/1995 | Nishimaki et al. | 228/102 |
| 5,566,876 A | * | 10/1996 | Nishimaki et al. | 228/102 |
| 5,576,828 A | * | 11/1996 | Tomiyama et al. | 356/625 |
| 5,676,302 A | * | 10/1997 | Petry, III | 228/104 |
| 5,754,679 A | * | 5/1998 | Koljonen et al. | 382/151 |
| 5,757,956 A | * | 5/1998 | Koljonen et al. | 382/151 |
| 5,828,449 A | * | 10/1998 | King et al. | 356/237.1 |
| 5,841,133 A | * | 11/1998 | Omi | 250/231.13 |
| 5,926,557 A | * | 7/1999 | King et al. | 382/149 |
| 5,991,040 A | * | 11/1999 | Doemens et al. | 356/614 |
| 6,330,066 B1 | * | 12/2001 | Tanaka et al. | 356/609 |
| 2005/0161592 A1 | * | 7/2005 | Watanabe et al. | 250/234 |

FOREIGN PATENT DOCUMENTS

| | | | |
|---|---|---|---|
| EP | 634791 A2 | * | 1/1995 |
| JP | 6-224267 | | 8/1994 |

* cited by examiner

*Primary Examiner*—Jonathan Johnson
*Assistant Examiner*—Rachel E. Beveridge (57) ABSTRACT

A method of measuring a thickness of a ball bonded to a pad is disclosed. The method includes: taking an image of the pad and the ball at each step position through an image taking means being shifted in a vertical direction at predetermined step intervals; obtaining luminance variations at an edge portion of the pad in each taken image to determine an in-focus height of the pad based on an image taking height position at which the taken image has the largest luminance variation at the edge portion of the pad; obtaining luminance variations on an upper surface of the ball in each taken image to determine an in-focus height of the upper surface of the ball based on an image taking height position at which the taken image has the largest luminance variation on the upper surface of the ball; and calculating the thickness of the ball by finding a difference between the obtained in-focus heights of the pad and the upper surface of the ball.

11 Claims, 6 Drawing Sheets

METHOD OF MEASURING THICKNESS OF BONDED BALL IN WIRE BONDING

BACKGROUND OF THE INVENTION

1. Field of the Invention

The present invention relates to a method for automatically measuring a thickness of a ball bonded to a pad of a semiconductor chip in wire bonding which attains wiring between the pad of the semiconductor chip and an external electrode by utilizing image processing.

2. Description of the Related Art

Figure 2A:
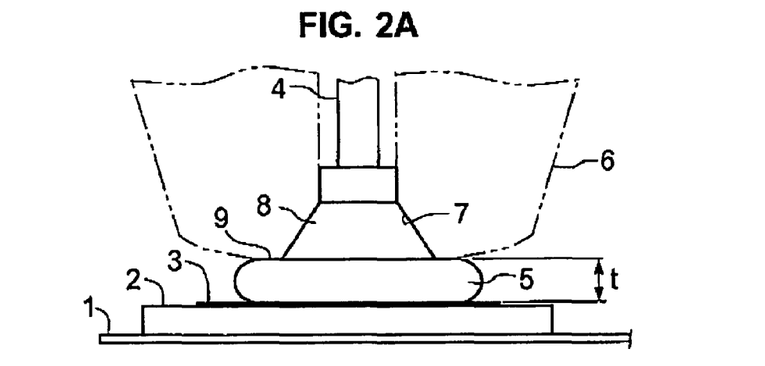
FIGS. 2A and 2B are elevational and plan views illustrating a bonded condition of a pad of a semiconductor chip and a ball in wire bonding.
Figure 2B:
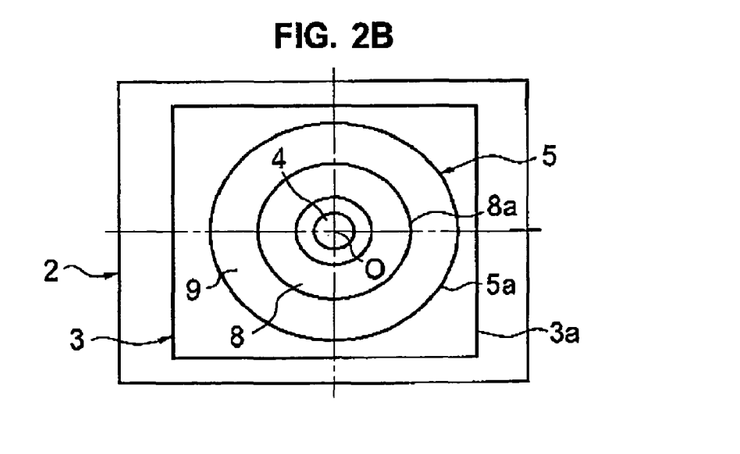

Referring first to FIGS. 2A and 2B, a bonded condition between a pad of a semiconductor chip and a ball in wire bonding will be described.

In FIGS. 2A and 2B, reference numeral 1 denotes a lead frame; 2 denotes a semiconductor chip mounted on the lead frame 1; 3 denotes a pad formed on the semiconductor chip 2 (a first bonding point); 4 denotes a bonding wire such as a gold wire; and 5 denotes a ball formed at the tip of the bonding wire 4 and bonded to the pad 3.

The ball 5 formed at the tip of the bonding wire 4 has an almost spherical shape before bonding and the ball 5 is pressedly bonded onto the pad 3 by applying supersonic vibration while pressing with a capillary 6 at the time of wire bonding, resulting in the bonded ball 5 being deformed or flattened as shown in FIG. 2A.

At the center of the top surface of the ball 5 bonded to the pad 3, a cone portion 8 with a conical shape is formed by an inside chamfer portion 7 recessed into the inside of the tip of the capillary 6, and an almost flat upper surface 9 is formed around the cone portion 8 of the ball 5.

As a measuring object of the present invention, the thickness of the bonded ball is a height t from a surface of the pad 3 to the flat upper surface 9 of the bonded ball 5.

Conventionally, when the thickness t of the bonded ball 5 is measured, the thickness t of the ball 5 is measured by the use of a metallographic microscope which can measure displacement in a Z-axis direction or a vertical direction by an operator manually focusing the microscope on each of the surface of the pad 3 and the upper surface 9 of the bonded ball 5, to thereby obtain a distance between two points in focus. In the case of such a manual measuring method, it is difficult to obtain a sufficient measurement accuracy because variations are generated depending on the operator who judges whether the microscope is accurately focused on the pad 3 and the upper surface 9 of the bonded ball 5.

Although another measuring method utilizing a laser beam is known in the art, since a width of the upper surface 9 of the bonded ball 5 has an extremely small dimension of a few microns, a problem is posed in that a system irradiating the laser beam to a spot in such a microscopic location will be considerably expensive.

In order to solve the problem described above, a method is proposed to measure the thickness t of the bonded ball 5, wherein a plane image of the cone portion 8 of the ball 5 captured through a lens of a camera is compared and checked with a reference pattern image of the cone portion which is set in advance and an image taking height position at which the images are best matched is regarded as an in-focus height (Japanese Patent Application Laid-Open Publication No. 6-224267).

However, in the case of the measuring method described in Japanese Patent Application Laid-open Publication No. 6-224267, since a shape and a size of a cone portion 8 is varied by a capillary 6 used, a pattern image of the cone portion 8 must be rerecorded each time the capillary 6 is replaced, resulting in cumbersome handling of an apparatus. Moreover, since the reference pattern image of the cone portion 8 is set manually, the setting varies between individuals, and a measurement result may change depending on how the pattern image is set.

SUMMARY OF THE INVENTION

The present invention has been made in view of the above problems. Accordingly, it is an object of the present invention to provide a method of measuring a thickness of a bonded ball in wire bonding, which can automatically measure the thickness of the bonded ball by utilizing image processing without manual work.

In accordance with the present invention, a method of measuring a thickness of a ball bonded to a pad of a semiconductor chip in wire bonding which attains wiring between the pad of the semiconductor chip and an external electrode is provided. The method comprises the steps of: taking a plane image of a bonding portion between the pad and the ball at each step position through an image taking means being shifted in a vertical direction at predetermined step intervals; obtaining luminance variations at an edge portion of the pad in each taken image and determining an in-focus height of the pad based on an image taking height position at which the taken image has the largest luminance variation at the edge portion of the pad; obtaining luminance variations on an upper surface of the bonded ball in each taken image and determining an in-focus height of the upper surface of the ball based on an image taking height position at which the taken image has the largest luminance variation on the upper surface of the ball; and calculating a thickness of the ball bonded to the pad by finding a difference between the obtained in-focus height of the pad and the obtained in-focus height of the upper surface of the bonded ball.

In a preferred embodiment of the present invention, the obtaining of luminance variations at the edge portion of the pad in each taken image and determining the in-focus height of the pad includes: setting a luminance detection window with a predetermined size and constituted by an array of pixels at the edge portion of the pad on the taken image so that the luminance detection window crosses the edge of the pad; obtaining, for the pixels in the luminance detection window, luminance differences between the adjacent pixels in a direction orthogonal to the edge of the pad to define a maximum value of the obtained difference luminance values as a luminance level of the pad in the taken image at one image taking height position; and defining, as the in-focus height of the pad, the image taking height position at which the taken image has the highest luminance level in all the taken images.

In a preferred embodiment of the present invention, a plurality of the luminance detection windows for determining the in-focus height of the pad are set; wherein the obtaining of luminance variations at the edge portion of the pad in each taken image and determining the in-focus height of the pad includes: calculating respective luminance levels for the plurality of luminance detection windows; and adding a plurality of the obtained luminance levels and defining the thus added value as a luminance level of the pad in the taken image.

In a preferred embodiment of the present invention, the determining of the in-focus height of the pad includes performing a quadratic curve approximation by the use of the luminance level of the pad on the taken image at each step position; wherein the image taking height position corresponding to a peak point position of the obtained approximated curve is defined as the in-focus height of the pad.

In a preferred embodiment of the present invention, the obtaining of luminance variations on the upper surface of the bonded ball in each taken image and determining the in-focus height of the upper surface of the ball includes: setting a luminance detection window with a predetermined size and constituted by an array of pixels at a portion of the upper surface of the ball on the taken image so as to extend the luminance detection window in a radial direction of the ball; obtaining, for the pixels in the luminance detection window, luminance differences between the adjacent pixels in the radial direction of the ball to define a luminance level of the upper surface of the ball in the taken image at one image taking height position by adding the obtained difference luminance values; and defining, as the in-focus height of the upper surface of the ball, the image taking height position at which the taken image has the highest luminance level in all the taken images.

In a preferred embodiment of the present invention, the obtaining of luminance variations on the upper surface of the bonded ball in each taken image and determining the in-focus height of the upper surface of the ball includes: calculating the luminance level of the luminance detection window at each rotation step position while rotating the luminance detection window for determining the in-focus height of the upper surface of the ball around the center point of the ball by a predetermined rotation step angle; and adding a plurality of the obtained luminance levels and defining the thus added value as a luminance level of the upper surface of the ball in the taken image.

In a preferred embodiment of the present invention, the determining of the in-focus height of the upper surface of the ball includes performing a quadratic curve approximation by the use of the luminance level of the upper surface of the ball on the taken image at each step position; wherein the image taking height position corresponding to a peak point position of the obtained approximated curve is defined as the in-focus height of the upper surface of the ball.

According to the measuring method of the present invention, the thickness of the bonded ball in wire bonding can be automatically measured by utilizing image processing without manual work. Therefore, the measuring method of the present invention can eliminate conventional problems of human measurement errors, to thereby perform extremely accurate measurement. In addition, since an expensive laser beam system is not needed, a measurement apparatus can be constructed at a decreased cost.

BRIEF DESCRIPTION OF THE DRAWINGS

The above and other objects, aspects, features and advantages of the present invention will become more apparent from the following detailed description when taken in conjunction with the accompanying drawings, in which.

DETAILED DESCRIPTION OF THE INVENTION

An embodiment of the present invention will now be described with reference to the drawings.

Figure 1:
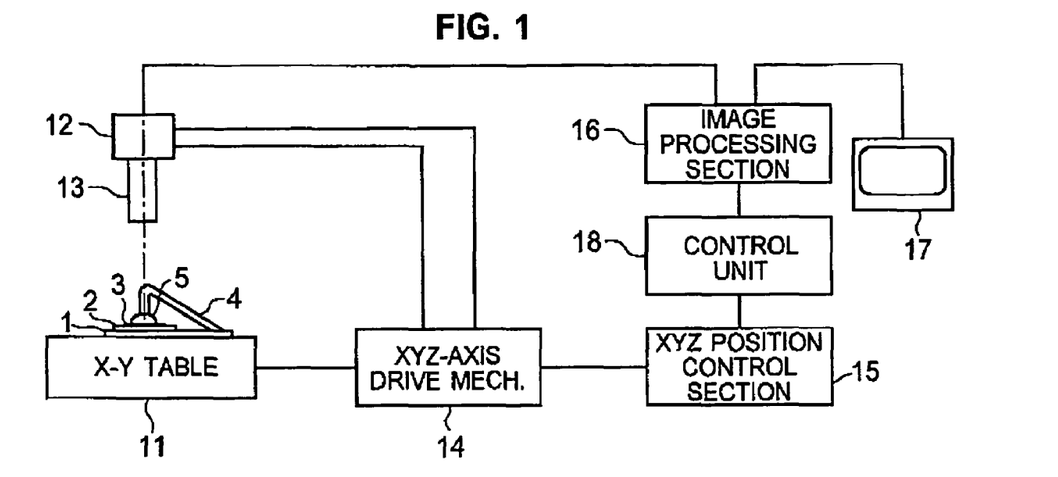
FIG. 1 is a block diagram showing an embodiment of a measurement apparatus for measuring a thickness of a bonded ball which is constructed so as to apply the method of the present invention thereto.

FIG. 1 shows an embodiment of a ball thickness measurement apparatus constructed to apply the method of the present invention thereto.

In FIG. 1, reference numeral 11 denotes an X-Y table movable in a horizontal plane; 12 denotes a camera movable in a Z-axis direction or a vertical direction for taking an image of a bonding portion between a pad 3 of a semiconductor chip 2 and a ball 5 from above; 13 denotes a lens of the camera 13; 14 denotes an XYZ-axis drive mechanism for moving the X-Y table 11 and the camera 12 to desired positions; 15 denotes an XYZ position control section for controlling the movements of the X-Y table 11 and camera 12 by the XYZ-axis drive mechanism 14; 16 denotes an image processing section for measuring a thickness t of the bonded ball 5, in which an image taken by the camera 12 is captured and image processed; 17 denotes a monitor for displaying the taken images and processed data; and 18 denotes a control unit for controlling processing operations of the entire apparatus.

A lead frame 1 equipped with the semiconductor chip 2 is mounted on the X-Y table 11, and the ball 5 formed at a tip of a bonding wire 4 is pressedly bonded onto the pad 3 of the semiconductor 2 by a capillary 6 (see FIG. 2A).

For the measurement apparatus with the above configuration, a measuring method of a ball thickness according to the present invention will be described in more detail hereinafter. In the method of the present invention, an in-focus height of the pad 3 and an in-focus height of a flat upper surface 9 of the bonded ball 5 (see FIG. 2A) are each automatically obtained through image processing, whereby the thickness t of the bonded ball 5 is determined based on the difference between the both obtained in-focus heights.

First, the processing for obtaining the in-focus height of the pad 3 will be described with reference to a flowchart of FIG. 3 and a taken image shown in FIG. 4.

Figure 3:
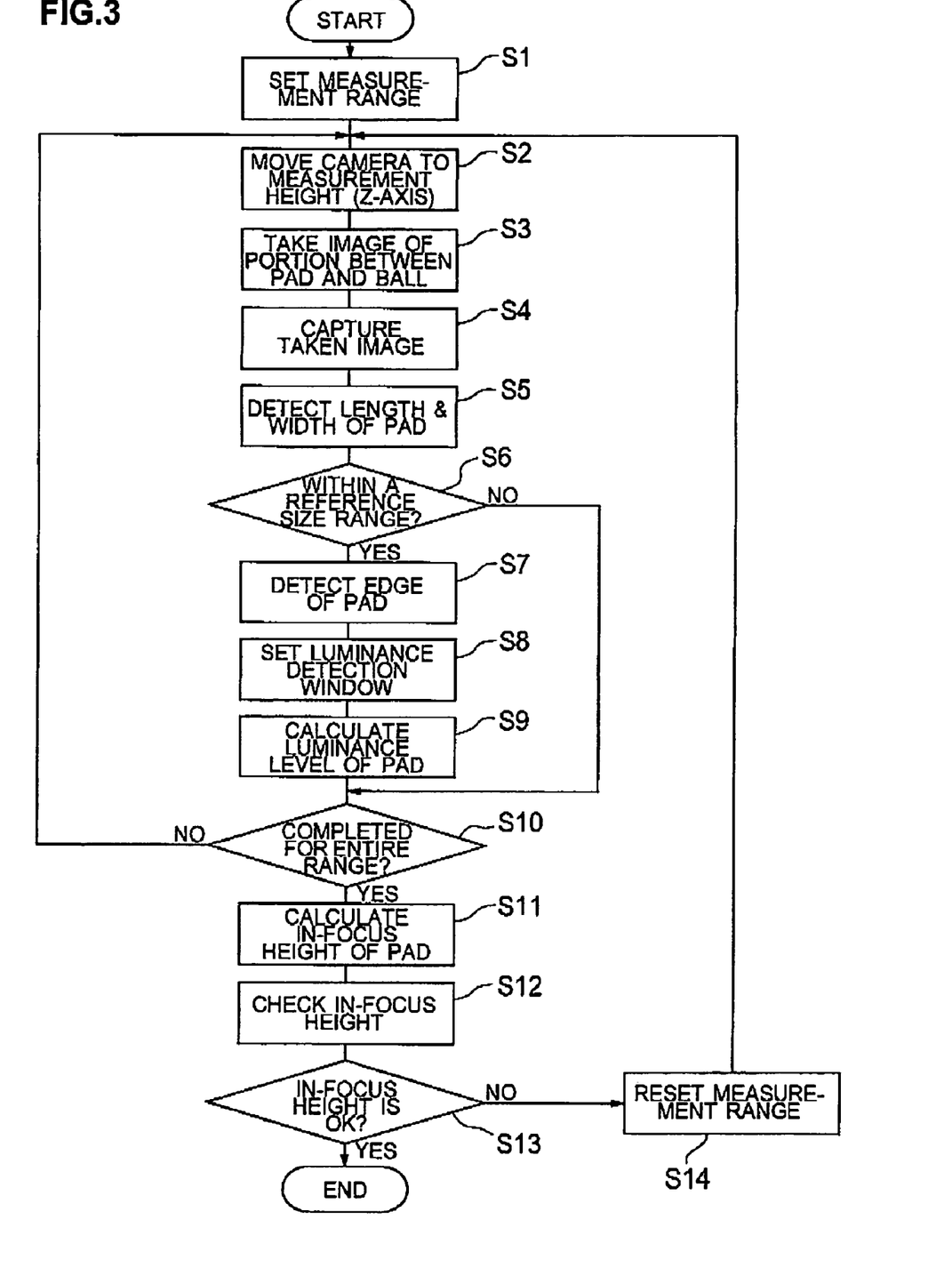
FIG. 3 is a flowchart of processing for obtaining an in-focus height of the pad.
Figure 4:
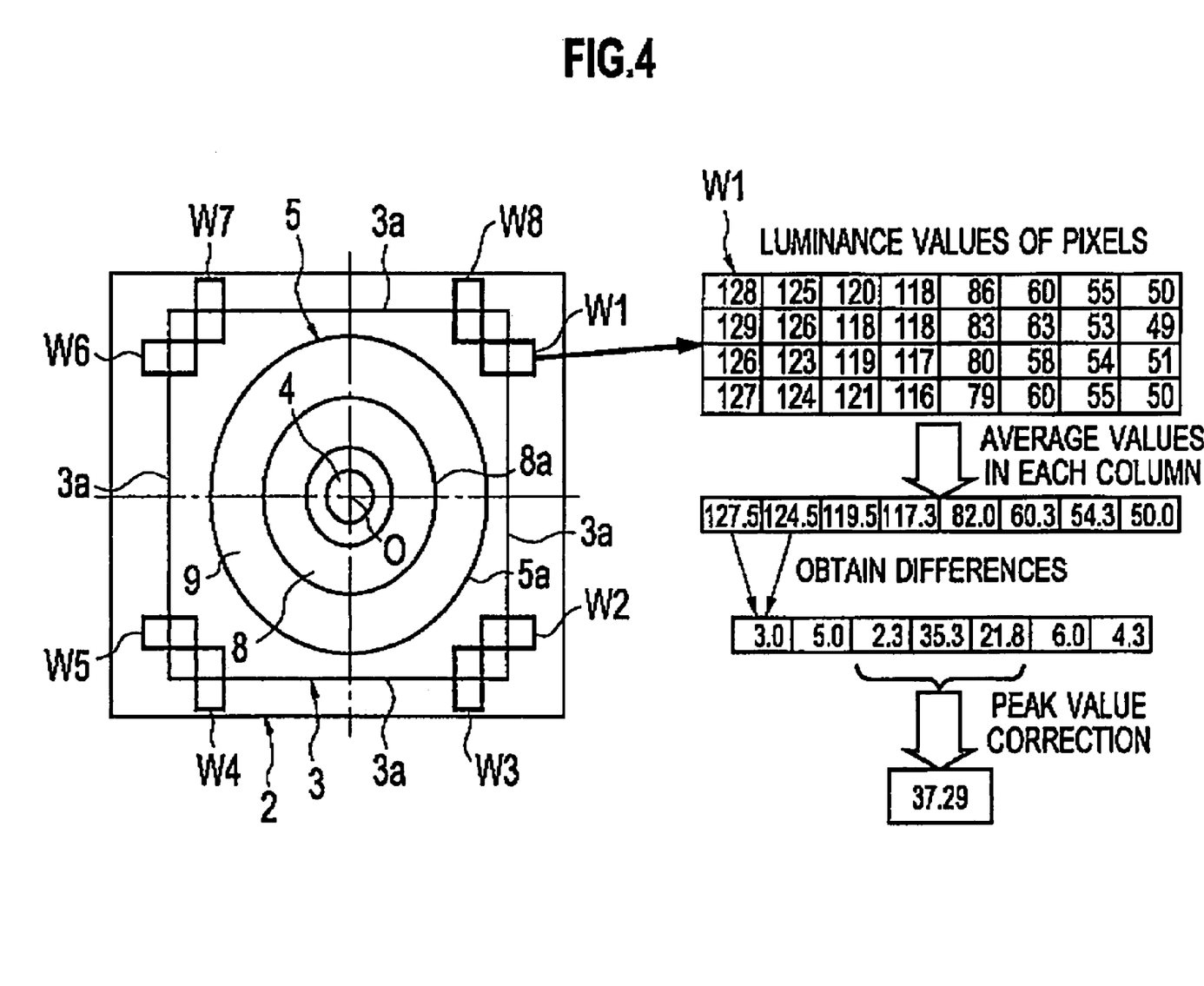
FIG. 4 is an explanatory view showing a principle of measuring the in-focus height of the pad.

When the processing is started, under the control of the control unit 18, the XYZ position control section 15 drives and controls the XYZ-axis drive mechanism 14 to move the camera 12 to a maximum-height position (or a minimum-height position) which is set in advance in a measurement range (steps S1 and S2 of FIG. 3), so that a plane image of a bonding portion between the pad 3 and the ball 5 is taken as shown in FIG. 4 at the maximum- or minimum-height position (step S3) and is transmitted to the image processing section 16.

The image processing section 16 captures the taken image thus transmitted thereto (step S4) and detects a length and a width of the pad 3 in the taken image by image processing (step S5), to thereby determine whether the length and width of the pad are each within a reference size range or not (step S6).

If the length or width of the pad 3 is not within the reference size range ("No" in step S6), it is determined that a normal measurement cannot be performed, and the procedure jumps to step S10 to determine whether measurements have been completed for the entire set measurement range or not. If the measurements have not been completed ("No" in step S10), the procedure returns to step S2 again to move the camera 12 by a predetermined increment or step distance (e.g. 1 μm) to a next height position, wherein the operations in steps S3 through S6 are repeated.

On the other hand, if the length and width are each within the reference size range ("Yes" in step S6), it is determined that a normal measurement can be performed, and the procedure moves to steps S7 to S9 to calculate a luminance level of the pad 3 in the taken image.

The calculation of the luminance level of the pad 3 is performed in a manner shown in FIG. 4.

More specifically, an edge 3a of the pad 3 is detected in the taken image (step S7), and luminance detection areas or windows W1 to W8 with a predetermined size are respectively set at, for example, eight (8) locations near the corners of the pad 3 so that each of the windows crosses the edge 3a of the pad 3 (step S8).

In the case of the example shown in FIG. 4, the size of the luminance detection windows W1 to W8 is set so that each luminance detection window is constituted by an array of pixels in four rows and eight columns, which window is has a four-pixel width in a direction parallel to the edge 3a of the pad 3 and an eight-pixel width in a direction orthogonal to the edge 3a (a total of 32 pixels), as illustrated as the luminance detection window W1 in the top-right section of FIG. 4.

After setting the eight (8) luminance detection windows W1 to W8, for each luminance detection window W1 to W8, luminance values of the pixels are added and averaged in each column or in the direction parallel to the edge 3a to obtain averaged luminance values; then differences between the adjacent averaged luminance values are obtained; and a maximum difference luminance value having a maximum value is selected from the obtained differences. Then, the maximum difference luminance values obtained from the respective luminance detection windows W1 to W8 are added, so that the added value is defined as a luminance level of the pad 3 in the taken image (step S9).

In a case of only one (1) luminance detection window being set, the maximum difference luminance value in the luminance detection window may be defined as the luminance level of the pad 3 in the taken image.

To facilitate understanding, the luminance detection window W1 of FIG. 4 will be specifically described.

For the luminance detection window W1 constituted by the array of pixels in four rows and eight columns (a total of 32 pixels), when assuming that luminance values of respective pixels have values shown in a table of the top-right section of FIG. 4, first, the luminance values of the pixels in each column are added in the direction parallel to the edge 3a of the pad 3, and then, the average value is obtained for each column as shown in a second table illustrated in FIG. 4.

Subsequently, for the eight (8) obtained average luminance values, differences are calculated between the adjacent average luminance values. From the difference luminance values obtained in this way, a difference luminance value having a maximum value (35.3 in FIG. 4) is defined as the maximum difference luminance value of the luminance detection window W1.

In the actual measurement, the edge 3a may lie or run on the middle of the pixel rather than just through the boundary between the adjacent pixels. In this case, the luminance value of the pixel overlapping with the edge may be smaller than the real value, and the resultant difference value may be smaller than the real value.

Therefore, although the maximum difference luminance value of 35.3 may be adopted as the maximum difference luminance value of the luminance detection window W1 without modification, it is preferable that a peak value correction be performed by a quadratic function approximation using the difference luminance values of 2.3 and 21.8 on both sides thereof, and the corrected peak be adopted as the maximum difference luminance value of the luminance detection window. For reference, a value of 37.29 is shown in FIG. 4 as a value after the peak value correction by the quadratic function approximation using the difference luminance values of 2.3 and 21.8 on both sides of 35.3.

When the maximum difference luminance value is obtained for each of the eight (8) luminance detection windows W1 to W8 in the described manner, the eight (8) obtained maximum difference luminance values are added, and the added value is defined as the luminance level of the pad 3 in the taken image (step 9).

After the luminance level is obtained for the pad 3 in the taken image, it is determined in step 10 whether the measurement of the luminance level is completed for the entire measurement range. If not completed ("No" in step S10), the procedure returns to step S2 to move the camera 12 to a next position at the predetermined step intervals (for example, intervals of 1 μm) and repeat the measurement operation of the luminance level of the pad 3 in each taken image.

When the measurement of the luminance level of the pad 3 in the taken image is completed for the entire predetermined measurement range ("Yes" in step S10), the processing is moved to step S11.

Then, a taken image with the largest calculated luminance level of the pad 3 is selected from all the taken images, and the image taking height position of the selected taken image is defined as an in-focus height of the pad 3 at which the camera 2 best focuses on the pad 3.

Since respective taken images are successively taken at the predetermined step intervals (for example, intervals of 1 μm), the exact in-focus height of the pad 3 may exist in an intermediate position between the steps, at which intermediate position an image is not taken actually by the camera 12. In addition, measurement errors are included in the luminance level of the pad 3 calculated as described above in each taken image.

Therefore, although the image taken height position at which the taken image has the highest luminance level of the pad 3 may be adopted as the in-focus height without modification, it is preferable that a quadratic function approximation of the in-focus height be performed using the luminance level data of the pad 3 in each taken image, and a peak position on the obtained approximated curve be adopted as an accurate in-focus height of the pad 3.

Figure 5:
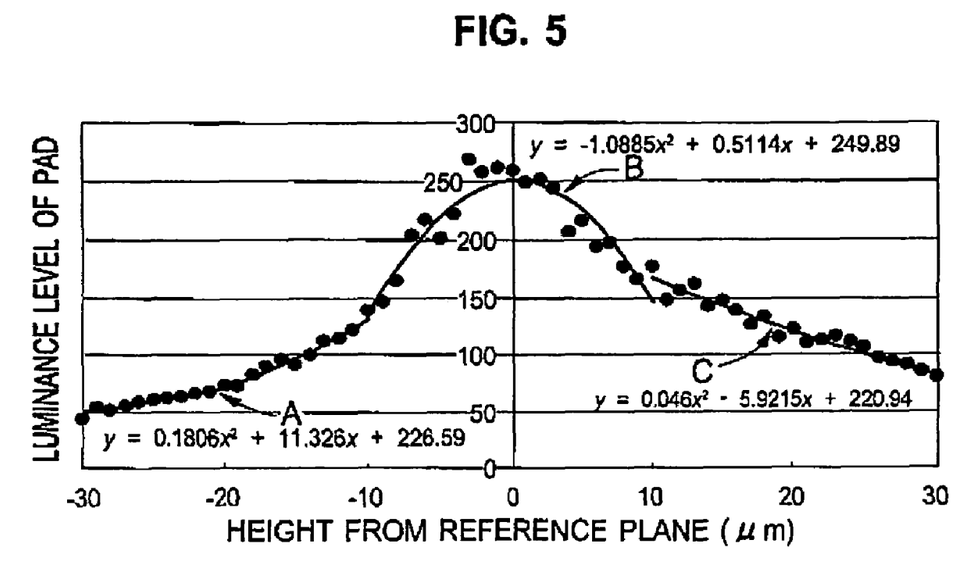
FIG. 5 is a diagram showing an example of a method for determining the in-focus height of the pad by a quadratic curve approximation.

FIG. 5 shows an example of calculation of the peak position by the quadratic function approximation.

FIG. 5 represents luminance level data of pad 3 plotted for 61 taken images successively taken at step intervals of 1 μm over a height range of ±30 μm in the upward and downward directions from a reference plane.

As shown in FIG. 5, since the calculated luminance level data of the pad 3 have irregularities due to measurement errors and the like, it is understood that the maximum luminance level position of the pad 3 is difficult to simply adopt as the in-focus height of the pad 3. Therefore, it is more rational to perform a quadratic function approximation using data of consecutive n points from the measured luminance data and determine the real in-focus height of the pad 3 based on the peak position on the obtained approximated curve.

For example, in FIG. 5, when the quadratic function approximation is performed using data of n=21 points in a range from −30 to −10 μm, an approximated curve A is obtained; when the quadratic function approximation is performed using data of n=21 points in a range from −10 to +10 μm, an approximated curve B is obtained; and when the quadratic function approximation is performed using data of n=21 points in a range from +10 to +30 μm, an approximated curve C is obtained, as respectively shown in FIG. 5.

It is apparent from the three (3) approximated curves A, B and C that the result of the quadratic function approximation may considerably vary depending on the data used and that the in-focus height can be accurately approximated by performing the quadratic function approximation with the luminance level data within a range expected to include the peak point, i.e., the luminance level data within a range from −10 to +10 μm.

Therefore, in the present invention, in order to achieve the optimum quadratic function approximation, a quadratic approximated curve, $y=ax^2+bx+c$ (where x represents a height from the reference plane and y represents a luminance level of the pad) for each data range while sequentially shifting a data range used for the quadratic function approximation, to thereby adopt a quadratic approximated curve with the smallest quadratic coefficient "a" in the obtained quadratic approximated curves as the approximated curve for calculating the in-focus height of the pad 3. In the example of FIG. 5, the quadratic coefficients "a" of the approximated curves A, B and C are 0.1806, −1.0885 and 0.046, so that the approximated curve B having the smallest value for the quadratic coefficient "a" (a=−1.0885) is selected as the quadratic approximated curve for calculating the in-focus height.

In order to obtain a peak point position from the approximated curve selected as above, by utilizing the fact that the approximated curve with the peak position is always an upwardly-convex quadratic curve, the peak point position may be defined as a position where an inclination on the upwardly-convex quadratic curve B (so-called first derivation) is zero, i.e., a position of x=−b/2a. In the case of the example of FIG. 5, since $y=-1.0885x^2+0.5114x+249.89$, x=−b/2a≈0.235, and the in-focus height of the pad 3 from the reference plane can be obtained as 0.235 μm.

When the in-focus height of the pad 3 is obtained in step 11 as described above, it is checked whether the obtained in-focus height can be accepted as truly correct or not (steps S12, S13). Since the quadratic curve with the peak value is an upwardly-convex quadratic curve, the quadratic coefficient "a" of the approximated curve $y=ax^2+bx+c$ is a negative value, which does not become a positive value. In addition, the in-focus height of the pad 3 has an acceptable range in design, and the obtained in-focus height must be within the acceptable range. In step S12 and S13, it is judged whether the obtained in-focus height of the pad 3 can be accepted as correct or not by checking whether the quadratic coefficient "a" is negative or positive, whether the in-focus height is within the acceptable range or not, and the like.

If the obtained in-focus height is accepted as correct ("Yes" in step S13), a series of processes is terminated. On the other hand, if the obtained in-focus height is not accepted as correct ("No" in step S13), it is considered that the measurement result cannot be adopted, and after setting the measurement range of the in-focus height again (step S14), the procedure returns to step S2 to repeat the measurement processing for the in-focus height of the pad 3.

In this way, the in-focus height of the pad 3 can be automatically obtained by image processing.

When the in-focus height of the pad 3 is measured, the following reasons exist for setting the luminance detection windows W1 to W8 so as to cross the edge 3a of the pad 3 and for utilizing the luminance differences between adjacent pixels within the luminance detection window.

In general, near the edge 3a of the pad 3, the luminance drastically changes between both sides of the edge 3a, and a degree of change in luminance greatly depends on whether the taken image is in focus or not. When the taken image is in focus, the taken image becomes clear, and thus the luminance difference between both sides of the edge 3a is increased. When the taken image is not in focus, the taken image is blurred, and thus the luminance difference between both sides of the edge 3a is decreased.

Therefore, by obtaining differences of luminance values between the adjacent pixels in the luminance detection window which is set to cross the edge 3a, how correctly the taken image is in focus or whether the taken image is in focus or not can be objectively known from the magnitude of the difference.

Accordingly, for each taken image successively taken at predetermined step intervals (for example, intervals of 1 μm) in the vertical direction, by calculating and comparing the luminance levels of the pad 3, objective and accurate determination can be made for which is the taken image in focus based on the magnitude of the luminance level.

Now, the processing for obtaining the in-focus height of the upper surface 9 of the bonded ball will be described with reference to a flowchart of FIG. 6 and a taken image shown in FIG. 7.

Figure 6:
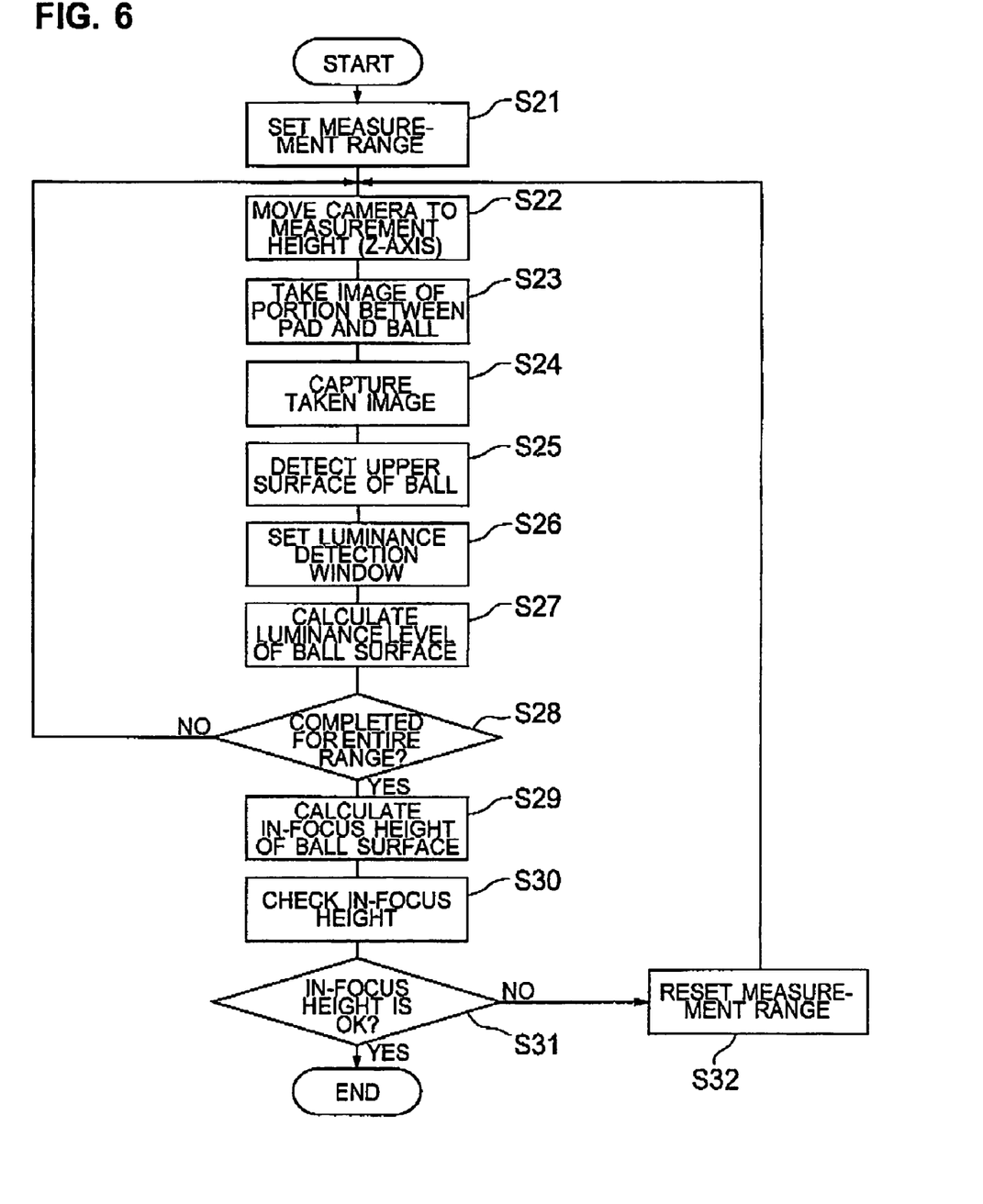
FIG. 6 is a flowchart of processing for obtaining an in-focus height of an upper surface of the bonded ball.
Figure 7:
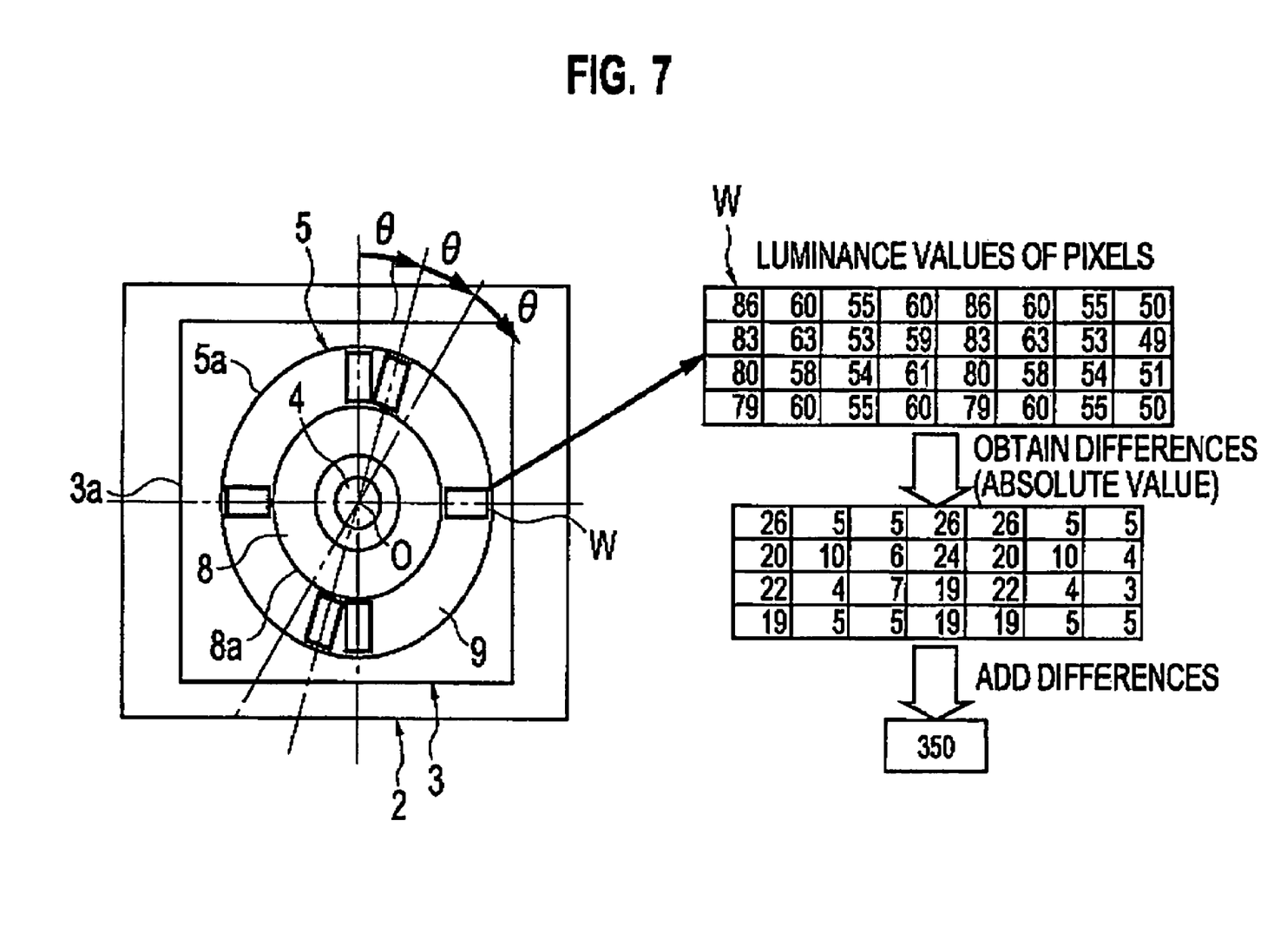
FIG. 7 is an explanatory view of a principle of measuring the in-focus height of the upper surface of the bonded ball.

When the processing is started, under the control of the control unit 18, the XYZ position control section 15 drives and controls the XYZ-axis drive mechanism 14 to move the camera 12 to a maximum-height position (or a minimum-height position) of a measurement range which is set in advance (steps S21 and S22 of FIG. 6), so that a plane image of the bonding portion between the pad 3 and the ball 5 is taken as shown in FIG. 7 at the height position (step S23) and is transmitted to the image processing section 16.

The image processing section 16 captures the taken image thus transmitted thereto (step S24) and calculates a luminance level of the upper surface 9 of the ball 5 in the taken image (step S25 to S27).

The calculation of the luminance level of the upper surface 9 of the ball 5 is performed in a manner shown in FIG. 7.

More specifically, first, a center point O of the ball 5, an outer peripheral edge 5a of the ball 5 and an outer peripheral edge 8a of the cone portion 8 are detected in the taken image captured, to thereby detect an area surrounded by the outer peripheral edge 5a of the ball 5 and the outer peripheral edge 8a of the cone portion 8, i.e., the flat upper surface 9 of the bonded ball 5 (step S25).

Then, a luminance detection window W having a predetermined size is set to be located on the upper surface 9 of the bonded ball 5 along a radial direction of the ball 5 (step 26).

In the case of the example shown in FIG. 7, the luminance detection window is constituted by an array of pixels in four rows and eight columns, which window has a four-pixel width in a direction orthogonal to the radial direction of the ball 5 and an eight-pixel width in a direction parallel to the radial direction of the ball 5 (a total of 32 pixels), as illustrated as the luminance detection window W in the top-right section of FIG. 7.

While the luminance detection window W is successively rotated around the center point O of the ball 5 by a predetermined rotation step angle θ, at each rotation step position, a difference luminance value between the adjacent pixels in each row is calculated in the luminance detection window W. Then, the difference luminance values in the luminance detection window are added, and the added value of the obtained difference luminance values is defined as a difference luminance value of the upper surface 9 of the bonded ball 5 at the rotation step position.

The difference luminance value of the upper surface 9 of the bonded ball 5 is obtained for each rotation step position, followed by adding the difference luminance value of the upper surface 9 of the bonded ball 5 thus obtained for each rotation step position, so that the added value of the obtained difference luminance values is defined as a luminance level of the upper surface 9 of the bonded ball 5 in the taken image.

To facilitate understanding, the processing will be specifically described with reference to FIG. 7.

For the luminance detection window W constituted by the array of pixels in four rows and eight columns (a total of 32 pixels), when assuming that luminance values of respective pixels have values shown in a table of the top-right section of FIG. 7 at the rotation step position situated on the right side of the horizontal center line shown in FIG. 7, difference operations are performed between the adjacent pixels along the radial direction of the ball 5 or in each row to obtain the difference luminance values (absolute values).

Subsequently, the 28 obtained difference luminance values are added, and the added value of 350 is defined as the difference luminance value of the upper surface 9 of the bonded ball 5 at the rotation step position shown in FIG. 7.

After the difference luminance value of the upper surface 9 of the bonded ball 5 is obtained for each rotation step position in the same manner as described above, the obtained difference luminance values of the upper surface 9 of the bonded ball 5 for respective rotation step positions are added, so that the added difference luminance value is defined as the luminance level of the upper surface 9 of the bonded ball 5 in the taken image.

When the luminance level of the upper surface 9 of the bonded ball 5 is obtained for one (1) taken image as described above (step S27), it is determined whether the measurement of the luminance level has been completed for the entire measurement range or not (step S28). If the measurement has not been completed ("No" in step S28), the procedure returns to step S22 to move the camera 12 to a next measurement position at the predetermined step intervals (for example, intervals of 1 μm) and repeat the calculation processing of the luminance level of the upper surface 9 of the bonded ball 5 at the position.

When the measurement of the luminance level of the upper surface 9 of the bonded ball 5 has been completed for the taken image at every step position within the measurement range ("Yes" in step S28), the processing proceeds to step S29 to determine the in-focus height of the upper surface 9 of the bonded ball 5 in the semiconductor chip 2.

The in-focus height of the upper surface 9 of the bonded ball 5 can be determined in such a manner that a taken image with the highest calculated luminance level of the upper surface 9 of the bonded ball 5 is selected from all the taken images taken at predetermined step intervals and the image taking height position of the selected taken image is defined as a position at which the camera 2 is best focused on the upper surface 9 of the ball 5, i.e., the in-focus height of the upper surface 9 of the bonded ball 5.

However, for the in-focus height of the upper surface 9 of the bonded ball 5, since respective taken images also are successively taken at the predetermined step intervals (for example, intervals of 1 μm), the exact in-focus height of the upper surface 9 of the bonded ball 5 may exist in an intermediate position between the steps, at which intermediate position an image is not taken actually by the camera 12.

Therefore, in determining the in-focus height of the upper surface 9 of the bonded ball 5, although the taken height position at which the taken image has the highest luminance level may be adopted as the in-focus height of the upper surface 9 of the bonded ball 5 without modification, as is the case for determining the in-focus height of the pad 3 described above, it is desirable to calculate a peak position of the in-focus height by a quadratic function approximation using the luminance level data of the upper surface 9 of the bonded ball 5 in each taken image and to adopt the peak position as the in-focus height of the upper surface 9 of the bonded ball 5.

After the in-focus height of the upper surface 9 of the bonded ball 5 is obtained in step 29 as described above, it is checked whether the obtained in-focus height can be accepted as truly correct or not (steps S30, S31). As noted above, since the quadratic curve with the peak value is an upwardly-convex quadratic curve, the quadratic coefficient "a" of the approximated curve $y=ax^2+bx+c$ is a negative value, which does not become a positive value. In addition, the in-focus height of the upper surface 9 of the bonded ball 5 also has an acceptable range in design, and the obtained in-focus height must be within the acceptable range. In step S30 and S31, it is judged whether the obtained in-focus height of the upper surface 9 of the bonded ball 5 can be accepted as correct or not by checking whether the quadratic coefficient "a" is negative or positive, whether the in-focus height is within the acceptable range or not, and the like.

If the obtained in-focus height is accepted as correct ("Yes" in step S31), a series of processes is terminated. On the other hand, if the obtained in-focus height is not accepted as correct ("No" in step S31), it is considered that the measurement result cannot be adopted, and after setting the measurement range of the in-focus height again (step S32), the procedure returns to step S22 to repeat the measurement processing for the in-focus height of the upper surface 9 of the bonded ball 5.

In this way, the in-focus height of the upper surface 9 of the bonded ball 5 can be automatically obtained by image processing based on the taken images taken by the camera 12.

When the in-focus height of the upper surface 9 of the bonded ball 5 is measured, the following reasons exist for setting the luminance detection window W at the portion of the upper surface 9 of the bonded ball 5 and for utilizing the luminance differences between adjacent pixels within the luminance detection window W.

If the luminance detection window W is set to cross the outer peripheral edge 5*a* of the ball 5 as is the case with the measurement of the in-focus height of the pad 3 described above, the obtained height will have the maximum luminance difference between the edge portion of the ball 5 and the pad 3. If such detection is performed, since the edge portion of the ball 5 has a circular-arc curved surface as apparent from FIG. 2A, the in-focus height of the upper surface 9 of the bonded ball 5 is likely to be obtained as a height lower than the height of the flat portion of the upper surface 9 of the bonded ball 5 which is actually attempted to be obtained. In addition, due to differences in the shape of the curved surface at the edge portion of the ball 5, variations may be generated in the detected heights. In fact, when the measurement was performed by setting the luminance detection window W at the edge portion of the ball 5, it was found that the value would be about 2 μm lower than the height of the flat portion of the upper surface 9 of the bonded ball 5.

Therefore, in the present invention, the luminance detection window W is set inside the upper surface 9 of the bonded ball 5, and the in-focus height of the upper surface 9 of the bonded ball 5 is obtained from the luminance differences between the adjacent pixels in the luminance detection window W. In general, the more correctly the upper surface 9 of the bonded ball 5 is focused, the more clearly fine texture patterns are visible on the upper surface 9 of the bonded ball 5, so that the luminance difference between the adjacent pixels becomes greater in the luminance detection window W. Accordingly, by obtaining and adding the luminance differences between the adjacent pixels and comparing the added values, the image taking height position at which the taken image has the largest value can be defined as the best focused position, i.e., the in-focus position of the upper surface 9 of the bonded ball 5.

When the in-focus height of the pad 3 and the in-focus height of the upper surface 9 of the bonded ball 5 are obtained as described above, a difference operation (subtraction) is performed between the obtained in-focus height of the pad 3 and the obtained in-focus height of the upper surface 9 of the bonded ball 5, with the result that the obtained difference value is defined as the thickness t of the bonded ball 5 (see FIG. 2A)

In this way, the thickness t of the bonded ball 5 in wire bonding can be automatically measured through the image processing without manual work.

In the above embodiment, the separate descriptions have been made for the measurement processing of the in-focus height of the pad 3 shown in FIGS. 3 and 4 and the in-focus height of the upper surface 9 of the bonded ball 5 shown in FIGS. 6 and 7 in order to facilitate understanding. However, in an actual apparatus, the measurement range is set to be a predetermined vertical range including both of the in-focus height of the pad 3 and the in-focus height of the upper surface 9 of the bonded ball 5, so that two types of the processing can be performed simultaneously in parallel at each vertical step position for taking an image.

The step intervals for shifting the camera 2 in the vertical direction, the size and the number of the luminance detection windows W1 to W8 for obtaining the in-focus height of the pad 3, and the size and the rotation step angle θ of the luminance detection window W for obtaining the in-focus height of the upper surface 9 of the bonded ball 5 may be set depending on the processing capacity of the processing section 16 and required measurement accuracy.

While the illustrative and presently preferred embodiment of the present invention has been described in detail herein, it is to be understood that the inventive concepts may be otherwise variously embodied and employed and that the appended claims are intended to be construed to include such variations except insofar as limited by the prior art.

What is claimed is:

1. A method of measuring a thickness of a ball bonded to a pad of a semiconductor chip in wire bonding which attains wiring between the pad of the semiconductor chip and an external electrode, comprising the steps of:

taking a plane image of a bonding portion between the pad and the ball at each step position through an image taking means being shifted in a vertical direction at predetermined step intervals;

obtaining luminance variations at an edge portion of the pad in each taken image and determining an in-focus height of the pad based on an image taking height position at which the taken image has the largest luminance variation at the edge portion of the pad;

obtaining luminance variations on an upper surface of the bonded ball in each taken image and determining an in-focus height of the upper surface of the ball based on an image taking height position at which the taken image has the largest luminance variation on the upper surface of the ball includes setting a luminance detection window with a predetermined size and constituted by an array of pixels at a portion of the upper surface of the ball on the taken image so as to extend the luminance detection window in a radial direction of the ball, obtaining, for the pixels in the luminance detection window, luminance differences between the adjacent pixels in the radial direction of the ball to define a luminance level of the upper surface of the ball in the taken image at one image taking height position by adding the obtained difference luminance values, and defining, as the in-focus height of the upper surface of the ball, the image taking height position at which the taken image has the highest luminance level in all the taken images; and calculating a thickness of the ball bonded to the pad by finding a difference between the obtained in-focus height of the pad and the obtained in-focus height of the upper surface of the bonded ball.

2. The method according to claim 1, wherein the obtaining of luminance variations on the upper surface of the bonded ball in each taken image and determining the in-focus height of the upper surface of the ball includes:

calculating the luminance level of the luminance detection window at each rotation step position while rotating the luminance detection window for determining the in-focus height of the upper surface of the ball around the center point of the ball by a predetermined rotation step angle; and adding a plurality of the obtained luminance levels and defining the thus added value as a luminance level of the upper surface of the ball in the taken image.

3. The method according to claim 2, wherein the determining of the in-focus height of the upper surface of the ball includes performing a quadratic curve approximation by the use of the calculation result of the luminance level of the upper surface of the ball on the taken image at each step position; and wherein the image taking height position corresponding to a peak point position of the obtained approximated curve is defined as the in-focus height of the upper surface of the ball.

4. The method according to claim 1, wherein the determining of the in-focus height of the upper surface of the ball includes performing a quadratic curve approximation by the use of the luminance level of the upper surface of the ball on the taken image at each step position; and wherein the image taking height position corresponding to a peak point position of the obtained approximated curve is defined as the in-focus height of the upper surface of the ball.

5. A method of measuring a thickness of a ball bonded to a pad of a semiconductor chip in wire bonding which attains wiring between the pad of the semiconductor chip and an external electrode, comprising the steps of:

taking a plane image of a bonding portion between the pad and the ball at each step position through a camera shifted progressively in one vertical direction at predetermined image taking step intervals;

detecting length and width of the pad from the plane image of the bonding images;

comparing a detected length and width of the pad with predetermined reference sizes and proceeding to the subsequent steps when the comparison indicates the detected height and width are within the predetermined reference sizes;

obtaining luminance variations at an edge portion of the pad in each taken image and determining an in-focus height of the pad based on an image taking height position at which the taken image has the largest luminance variation at the edge portion of the pad;

obtaining luminance variations on an upper surface of the bonded ball in each taken image and determining an in-focus height of the upper surface of the ball based on an image taking height position at which the taken image has the largest luminance variation on the upper surface of the ball includes setting a luminance detection window with a predetermined size and constituted by an array of pixels at a portion of the upper surface of the ball on the taken image so as to extend the luminance detection window in a radial direction of the ball, obtaining, for the pixels in the luminance detection window, luminance differences between the adjacent pixels in the radial direction of the ball to define a luminance level of the upper surface of the ball in the taken image at one image taking heiaht position by adding the obtained difference luminance values, and defining, as the in-focus heiaht of the upper surface of the ball, the image taking height position at which the taken image has the highest luminance level in all the taken images; and calculating a thickness of the ball bonded to the pad by finding a difference between the obtained in-focus height of the pad and the obtained in-focus height of the upper surface of the bonded ball.

6. The method according to claim 5 further including the step of setting a different initial height position of the camera relative to the pad when the comparison of the detected length and width of the pad are not within the predetermined reference sizes.

7. The method according to claim 5, wherein the obtaining of luminance variations on the upper surface of the bonded ball in each taken image and determining the in-focus height of the upper surface of the ball includes:

calculating the luminance level of the luminance detection window at each rotation step position while rotating the luminance detection window for determining the in-focus height of the upper surface of the ball around the center point of the ball by a predetermnined rotation step angle; and adding a plurality of the obtained luminance levels and defining the thus added value as a luminance level of the upper surface of the ball in the taken image.

8. A method of measuring a thickness of a ball bonded to a paid of a semiconductor chip in wire bonding which attains wiring between the pad of the semiconductor chip and an external electrode, comprising the steps of:

setting an initial measurement range;

taking a plane image of a bonding portion between the pad and the ball at each step position through a camera shifted progressively in one vertical direction at predetermined image taking step intervals within the initial measurement range;

detecting length and width of the pad from the plane image of the bonding images;

comparing a detected length and width of the pad with predetermined reference sizes and proceeding to subsequent steps when the comparison indicates the detected height and width are within the predetermined reference sizes;

obtaining Imninance variations at an edge portion of the pad in each taken image and determining an in-focus height of the pad based on an image taking height position at which the taken image has the largest luminance variation at the edge portion of the pad;

comparing the in-focus height of the pad with a predetermined reference height range and proceeding to subsequent steps when the comparison indicates an acceptable in-focus height;

obtaining luminance variations on an upper surface of the bonded ball in each taken image and determining an in-focus height of the upper surface of the ball based on an image taking height position at which the taken image has the largest luminance variation on the upper surface of the ball includes setting a luminance detection window with a predetermined size and constituted by an array of pixels at a portion of the upper surface of the ball on the taken image so as to extend the luminance detection window in a radial direction of the ball, obtaining, for the pixels in the luminance detection window, luminance differences between the adjacent pixels in the radial direction of the ball to define a luminance level of the upper surface of the ball in the taken image at one image taking height position by adding the obtained difference luminance values, and defining, as the in-focus heiaht of the upper surface of the ball. the image taking height position at which the taken image has the highest luminance level in all the taken images; and calculating a thickness of the ball bonded to the pad by finding a difference between the obtained in-focus height of the pad and the obtained in-focus height of the upper surface of the bonded ball.

9. The method according to claim 8 further including the step of setting a different initial height position of the camera relative to the pad when the comparison of the detected length and width of the pad are not within the predetermined reference sizes.

10. The method according to claim 9 further including the step of setting a different initial height position of the camera relative to the pad when the comparison of the in-force height of the pad is not within the predetermined reference height range.

11. The method according to claim 8, wherein the obtaining of luminance variations on the upper surface of the bonded ball in each taken image and determining the in-focus height of the upper surface of the ball includes:

calculating the luminance level of the luminance detection window at each rotation step position while rotating the luminance detection window for determining the in-focus height of the upper surface of the ball around the center point of the ball by a predetermined rotation step angle; and adding a plurality of the obtained luminance levels and defining the thus added value as a luminance level of the upper surface of the ball in the taken image.

* * * * *